US009021154B2

(12) United States Patent
Morris et al.

(10) Patent No.: US 9,021,154 B2
(45) Date of Patent: Apr. 28, 2015

(54) READ TRAINING A MEMORY CONTROLLER

(71) Applicant: Intel Corporation, Santa Clara, CA (US)

(72) Inventors: Tonia G. Morris, Irmo, SC (US); Jonathan C. Jasper, San Jose, CA (US); Arnaud J. Forestier, Aliso Viejo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/040,548

(22) Filed: Sep. 27, 2013

(65) Prior Publication Data

US 2015/0095565 A1   Apr. 2, 2015

(51) Int. Cl.
G06F 13/28 (2006.01)
G11C 7/10 (2006.01)
G06F 13/16 (2006.01)
G06F 13/00 (2006.01)

(52) U.S. Cl.
CPC .......... G06F 13/1689 (2013.01); G11C 7/1036 (2013.01)

(58) Field of Classification Search
None
See application file for complete search history.

(56) References Cited

U.S. PATENT DOCUMENTS

| 6,570,944 | B2 | 5/2003 | Best et al. |
| 6,958,634 | B2 | 10/2005 | Rashid |
| 6,995,594 | B2 | 2/2006 | Buchwald et al. |
| 7,403,584 | B2 | 7/2008 | Koenenkamp |
| 7,814,401 | B2 | 10/2010 | Alrod et al. |
| 7,886,174 | B2 | 2/2011 | Spry et al. |
| 2008/0052449 | A1 | 2/2008 | Kim et al. |
| 2009/0031091 | A1* | 1/2009 | Chang et al. ............. 711/154 |
| 2011/0078370 | A1 | 3/2011 | Chaudhuri et al. |
| 2011/0307671 | A1* | 12/2011 | Fox et al. ............. 711/154 |
| 2012/0030153 | A1 | 2/2012 | Yoon |
| 2012/0066471 | A1 | 3/2012 | Sadowski et al. |
| 2012/0246396 | A1 | 9/2012 | Roohparvar |

OTHER PUBLICATIONS

Aytur, T. et al., "The Design of a High Speed Serial Link for IRAM", CS 254 Project Report, [online], Dec. 8, 1997, [Retrieved on Oct. 31, 2104], retrieved from the Internet at <URL: http://iram.cs.berkeley.edu/serialio/cs254/ >, 41 pp.
JEDEC Solid State Technology Association, "JEDEC Standard: DDR3 SDRAM", JESD79-3C, Nov. 2008, 211 pp.
JEDEC Solid State Technology Association, "JEDEC Standard: DDR4 SDRAM", JESD79-4, Sep. 2012, 214 pp.
JEDEC Solid State Technology Association, "JEDEC Standard: Double Data Rate (DDR) SDRAM Specification", JESD79C, Mar. 2003, 82 pp.

(Continued)

Primary Examiner — Scott Sun
(74) Attorney, Agent, or Firm — Konard Raynes Davda & Victor LLP; David W. Victor

(57) ABSTRACT

Provided are a device and computer readable storage medium for programming a memory module to initiate a training mode in which the memory module transmits continuous bit patterns on a side band lane of the bus interface; receiving the bit patterns over the bus interface; determining from the received bit patterns a transition of values in the bit pattern to determine a data eye between the determined transitions of the values; and determining a setting to control a phase interpolator to generate interpolated signals used to sample data within the determined data eye.

20 Claims, 5 Drawing Sheets

(56) References Cited

OTHER PUBLICATIONS

Micron Technology, Inc., "Double Data Rate (DDR) SDRAM", 2003, 77 pp.

Pagiamtzis, K., "ECE1352 Analog Integrated Circuits Reading Assignment: Phase Interpolating Circuits", Nov. 12, 2001, 21 pp.

Rambus Inc., "Phase Interpolator Based CDR", [online], 2013, [retrieved Sep. 7, 2013], retrieved from the Internet at <URL: http://www.rambus.com/us/technology/innovations/detail/phase_interpol . . . >, 4 pp.

U.S. Appl. No. 14/580,869, filed Dec. 23, 2014, invented by T.G. Morris et al., 29 pp. [77.284C1 (Appln)].

U.S. Appl. No. 14/580,976, filed Dec. 23, 2014, invented by T.G. Morris et al., 29 pp. [77.284C2 (Appln)].

U.S. Appl. No. 14/581,011, filed Dec. 23, 2014, invented by T.G. Morris et al., 29 pp. [77.284C3 (Appln)].

International Search Report and Written Opinion for International Application No. PCT/US2014/048719, dated Novemebr 28, 2014, 14 pp. [77.284PCT (ISR & WO)].

\* cited by examiner

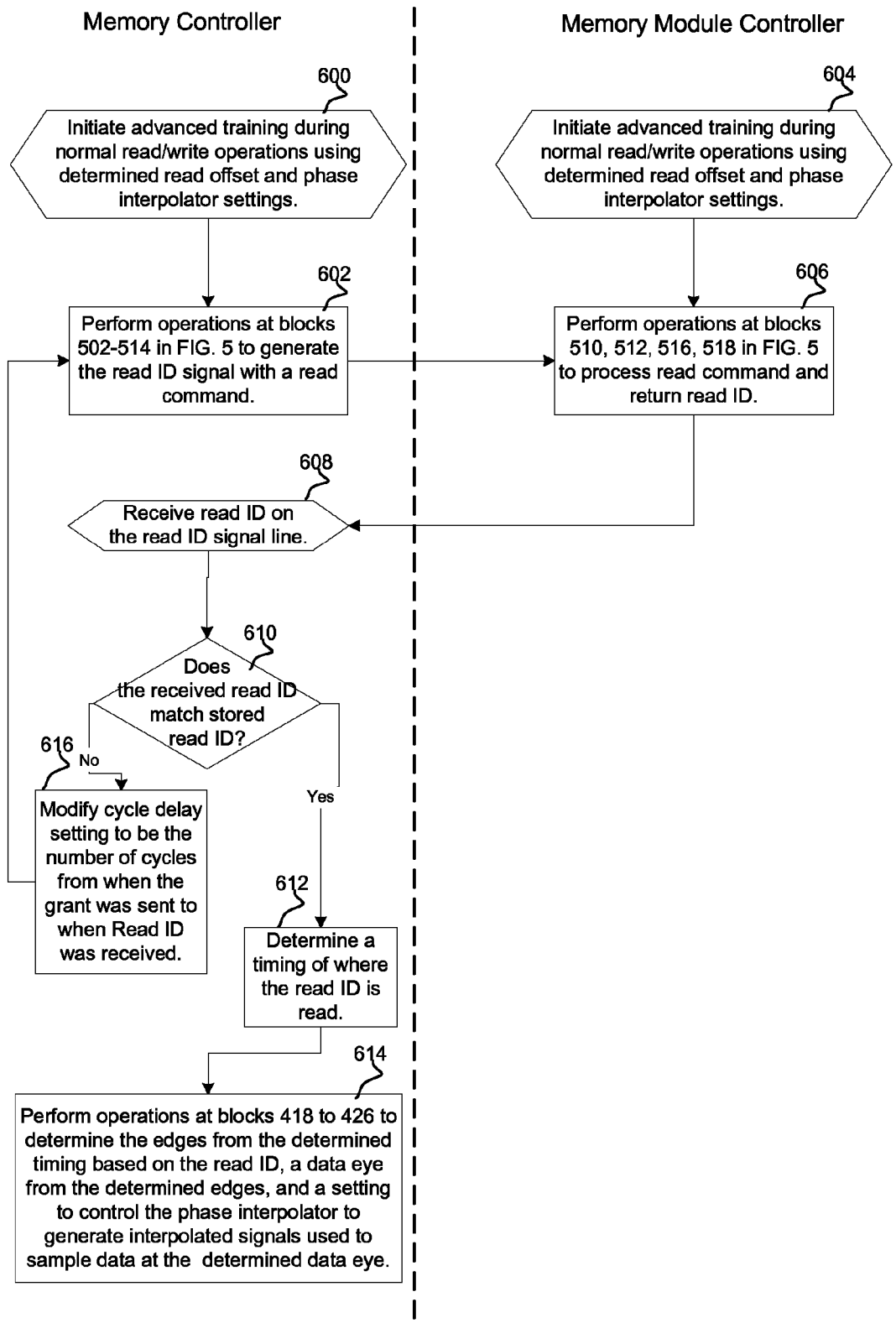

READ TRAINING A MEMORY CONTROLLER

TECHNICAL FIELD

Embodiments described herein generally relate to a memory system in which a memory controller communicates on a single channel or bus with multiple memory modules that have a pin layout compatible with the slots coupled to the channel and memory controller.

BACKGROUND

A memory controller manages the flow of data between a processor and a one or more memory modules on an interface or bus. The memory controller contains the logic needed to read and write to a memory module and refresh the data stored in the DRAM. is implemented as a separate chip. The memory controller supports a protocol used by multiple memory modules coupled to the channel, such as the Joint Electron Device Engineering Council (JEDEC) Double Data Rate Third Generation (DDR3) Synchronous Dynamic Random Access Memory (SDRAM) protocol.

Before using the interface to memory, the memory controller must configure the memory modules for operations by adjusting the timing at which the memory controller will activate to sample read data from the memory modules. A signal alignment device, such as a phase interpolator, is controlled by the memory controller to generate clock phase information and is responsive to phase control signals and reference signals having different determined phases to align the data sampling signal to sample the read data center at the center at which the read data will be transmitted or the data eye.

BRIEF DESCRIPTION OF THE DRAWINGS

Embodiments are described by way of example, with reference to the accompanying drawings, which are not drawn to scale, in which like reference numerals refer to similar elements.

FIG. 6 illustrates an embodiment of operations to perform training of the phase interpolator during normal read operations.

DESCRIPTION OF EMBODIMENTS

On a memory interface, the memory module transmits strobe signals with the data signal to the memory controller, where the memory controller processes the strobe signals to determine when to turn on the receivers and read the data. The memory controller may then use other procedures to determine where to sample the read data to read, such as using a phase interpolator.

Described embodiments provide techniques to perform fine read training, followed by coarse read training, and then advanced read training to adjust a phase interpolator during normal read operations. Described embodiments provide a side band signal lane for the memory module to return signals used by the memory controller to adjust the phase interpolator. Further, the memory controller provides the memory module signal patterns which the memory module returns over the side band lane on the bus separate from the data and command bus lines for the memory controller to use to determine a read offset timing of when to turn on receivers to sample the returned read data.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Certain embodiments relate to memory devices electronic assemblies. Embodiments include both devices and methods for forming electronic assemblies.

Figure 1:
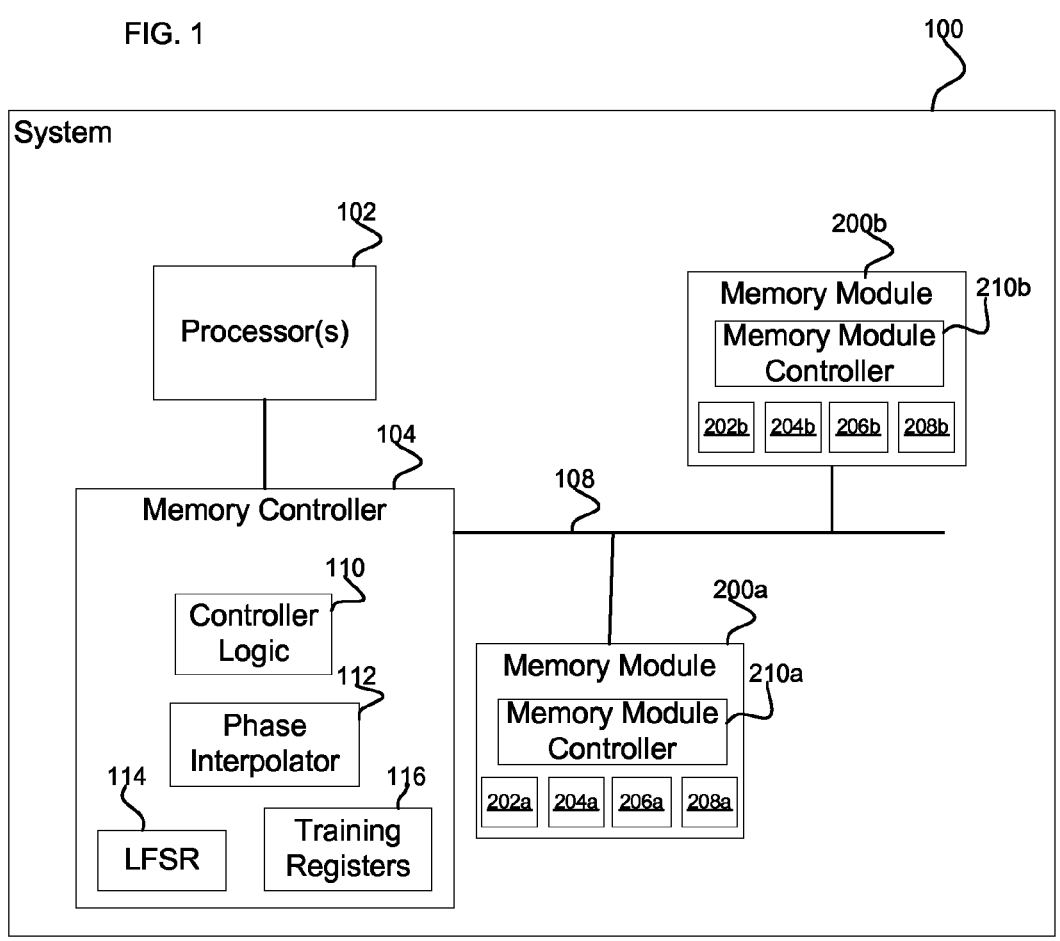
FIG. 1 illustrates an embodiment of a system having a memory system.

FIG. 1 illustrates an embodiment of a computing system 100 including one or more processors 102, a memory controller 104 and multiple memory modules 200a, 200b, which are typically mounted on a motherboard. The processors 102 may comprise a central processing unit, multi-core processor. The memory controller 104, in response to memory access requests from the processors 102, communicates with multiple memory modules 200a, 200b over a bus 108, also referred to as a channel, bus interface, etc., where both memory modules 200a, 200b are separately and independently connected to the same bus 108. The memory controller 104 may include controller logic 110 comprising the code or logic executed to perform operations; a phase interpolator 112 for receiving input timing signals and producing an interpolated sampling signal aligned with the data eye of the received read data signal; a Linear Feedback Shift Register (LFSR) 114 to generate random read identifiers used in the coarse and advanced read training phases; and training registers 116 to store values used during the training operations.

In the embodiment of FIG. 1, the memory modules 200a, 200b are mounted in slots or memory sockets on the system 100 motherboard. The memory modules 200a, 200b may comprise the same or different types of memory modules that have a pin arrangement compatible with the pin arrangement in the memory slots on the motherboard. Further, the memory modules may support the same or different memory protocols, such as Double Data Rate Fourth Generation (DDR4) protocol and additional protocols. Although only two memory modules 200a, 200b are shown, there may be multiple memory modules Each of the memory modules 200a, 200b include memory chips 202a, 204a, 206a, 208a and 202b, 204b, 206b, 208b, respectively, on one or both sides of the memory module 200a, 200b, to store the data. The memory chips, e.g., DRAM chips, located on one or both sides of the memory module package 200a, 200b, comprise the storage elements that store data being used by the processor 102.

Each memory module 200a, 200b may include a memory module controller 210a, 210b to coordinate memory management and access operations with the memory controller 104. The memory controller 104 includes logic, such as logic 110, to manage read training operations, read and write operations and memory management operations with respect to the memory modules 200a, 200b connected to the bus 108, and interface the processor 2 to the memory modules 200a, 200b. The memory controller 104 and/or the memory modules 200a, 200b may be integrated with the processor 102 or implemented in logic separate from the processor 102 on the system 100 motherboard as shown in FIG. 1.

The system 100 motherboard may include a memory socket compatible with different types of memory chips, to allow different types of memory modules 200a, 200b supporting different types of memory devices supporting different memory protocols as long as the different types of memory modules 200a,200b are compatible with the pin architecture in the memory sockets.

In one embodiment, the memory modules 200a, 200b may comprise a same or different type of Double data rate synchronous dynamic random-access memory (DDR SDRAM) memory module, such as LPDDRs, Dual In-Line Memory Modules (DIMMs), such as unbuffered DIMMs (UDIMM), Load Reduced Dual-inline Memory Module (LRDIMM), a Small Outline Dual In-line Memory Module (SODIMM), etc. The memory modules 200a, 200b may implement various forms of memory, including, but not limited to, NAND (flash) memory, ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM), Spin Transfer Torque (STT)-MRAM, etc.

Figure 2:
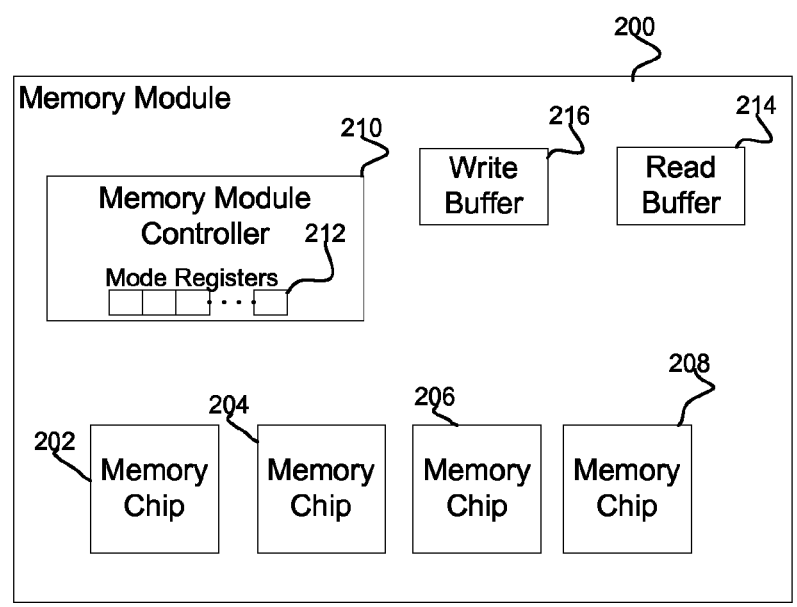
FIG. 2 illustrates an embodiment of a memory module.

FIG. 2 provides further details of an embodiment of a memory module 200, such as the memory modules 200a, 200b, as including a memory module controller 210 performing the memory module operations and interactions with the memory controller 104. The memory module 200 may include mode registers 212 in the memory module controller 210 having data which may be configured using a Mode Register Set (MRS) command, a read buffer 214 and a write buffer 216 to buffer read and write data for the memory chips 202, 204, 206, 208. The buffers 214, 216 may be implemented within the memory module controller 210 or in circuitry external to the memory module controller 210 in the memory module 200. In further embodiments, the mode registers 212 may be implemented in the memory chips 202, 204, 206, 208.

The code or logic implementing memory module controller 210 and memory controller 104 operations may be implemented as computer readable code loaded into a memory and executed by a processor or may be encoded in hardware logic, such as in an Application Specific Integrated Circuit (ASIC), Field Programmable Gate Array (FPGA), etc.

The logic or code of the described embodiments may be implemented in a machine-readable storage medium comprising in a device or apparatus having electrical and other hardware elements for storing the machine-executable instructions. The machine-readable medium may include, but is not limited to, flash memory, optical disks, compact disksread only memory (CD-ROM), digital versatile/video disks (DVD) ROM, random access memory (RAM), erasable programmable read-only memory (EPROM), electrically erasable programmable read-only memory (EEPROM), magnetic or optical cards, and other machine-readable media suitable for storing electronic instructions.

In alternative implementations, the logic or code of the described embodiments may be implemented in a signal transmission medium.

Figure 3:
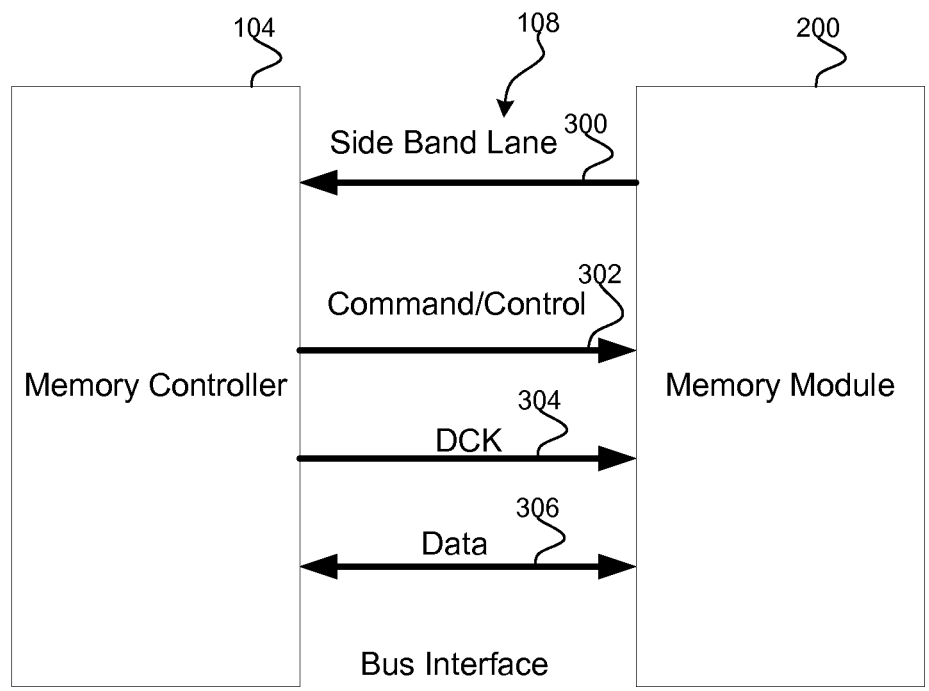
FIG. 3 illustrates an embodiment of a bus interface between the memory controller and the memory module.

FIG. 3 illustrates an embodiment of the bus interface lines 108 between the memory controller 104 and the memory module 200, including a side band lane 300 having side band lines; command and control signal lines 302 on which the memory controller 104 communicates commands to the memory module 200; a differential clock input signal (DCLK) 304 from the memory controller 104 to the memory module 200 for the memory module 200 to use to sample address and control signals on the command/control lines 302; and data lines 306 on which read and write data is transmitted between the memory controller 104 and the memory module 200. Additional bus lines may be included for other purposes.

The side band lane 300 has one or more signal lines to transmit additional information that the memory controller 104 can use for training and other purposes, and in response to control signals from the memory controller 104. For instance, the memory controller 104 may send a grant message to the memory module 200 in response to receiving a read received acknowledgment, which may cause the memory module 200 to send a read identifier (ID) signal on the side band lane 300 before sending the data. The memory module 200 may use the side band lane 300 to communicate a read ID the memory controller 104 previously transmitted with a read request and, in response, the memory module 200 may loopback the read ID on the side band lane 300 without processing, e.g., filtering, interpretation, etc. Further, in certain embodiments, the side band lane 300 may comprise clock signal pairs on the memory module 200

In one embodiment the side band lane 300 that transmit the read ID back to the memory controller 104 transmits signals at the command frequency, not the clock frequency. In one embodiment, the side band lane 300 may be intended to transmit clocks and transmit a clock pattern that is twice the period of the clock input signal (DCLK) 304. The memory module 200 may transmit signals and a received read ID, as part of a control signal, on the side band lane 300 before transmitting the read data. These read ID signals may transmit a burst of data, with a specific timing relationship relative to a control signal, such as a grant signal. This timing relationship may vary within a range, depending on the memory module delays and the channel. In certain embodiments, the memory module 200 may not transmit a strobe with the data burst, so that the memory controller 104 performs the fine read training to train the read ID signal sampling delays to align on the center of the read ID signaling eye to achieve a low bit error rate. The read ID signals may be transmitted at half the frequency of the data bus, but these speeds can still get up to 1600 MTps.

Figure 4:
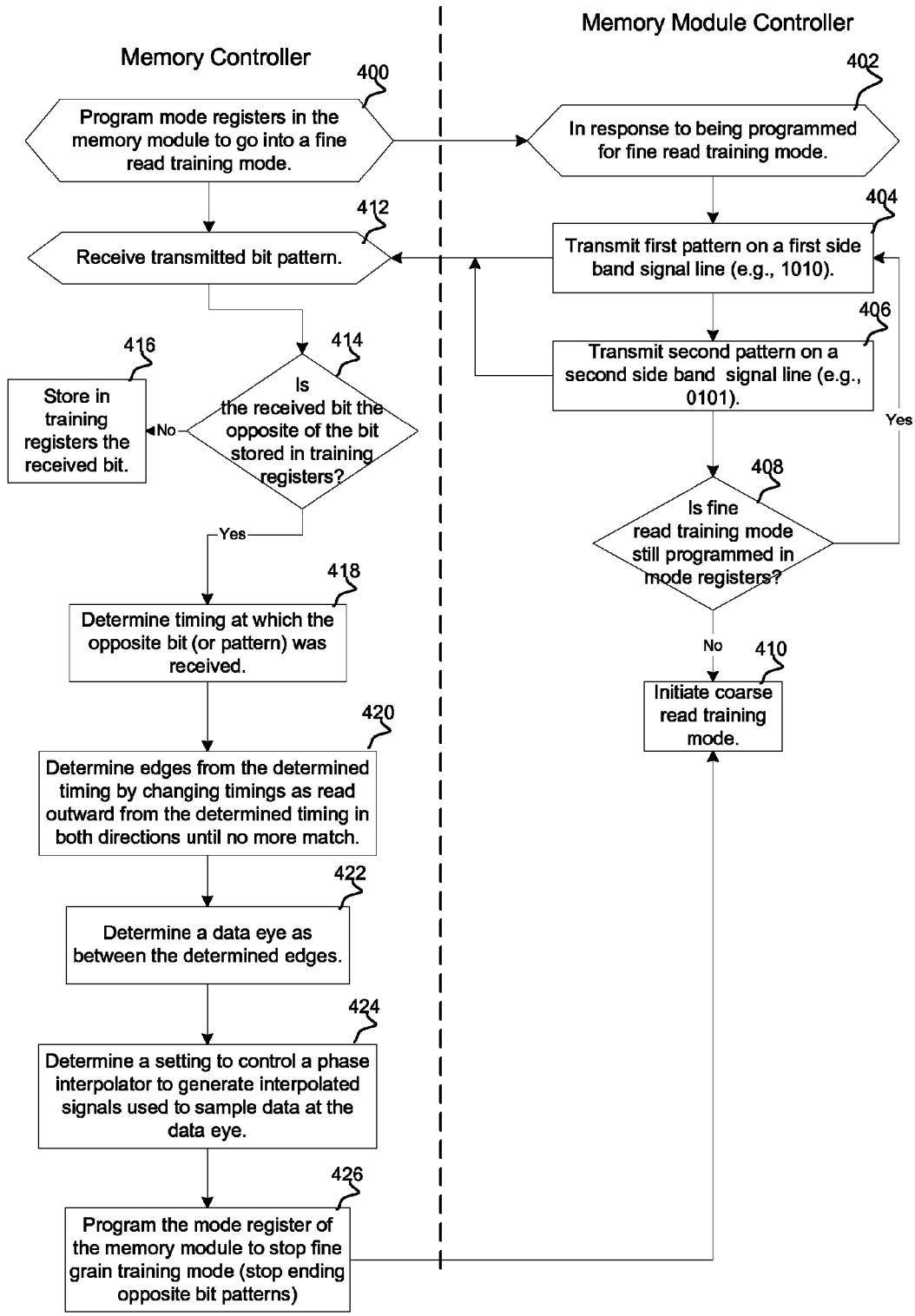
FIG. 4 is an embodiment of operations to perform fine read training to adjust the phase interpolator to generate a sample signal.

FIG. 4 illustrates an embodiment of operations performed by the memory controller logic 110 and the memory module controller 202 logic to allow the memory controller logic 110 in conjunction with the memory module 200 to perform fine read training of the phase interpolator 112 to provide interpolated sample signals aligned at the data eye. The fine read training may be initiated during a probing of the bus 108 during a boot of the system 100. To initiate the fine read training, the memory controller logic 110 transmits a command (at block 400) to program the mode registers 212 in the memory module 200 to begin a fine read training mode. In response to having the mode registers 212 written to indicate the fine read training mode, the memory module controller 210 transmits (at blocks 404 and 406) a first pattern on a first side signal line of the side band lane 300 and a second pattern on a second signal line, different from the first signal line, on the side band lane 300. The first and second patterns may comprise clock signals having opposite values, such as 1010 and 0101. In certain embodiments, the clock patterns may have a period twice the period of the DCLK 304 clock signal, and may have a frequency at the command/control signal line 302, not the clock frequency 304. The signals, such as 1010 and 0101, on separate signal lines of the side band lane 300 may be out of phase or in-phase. Further, the transmitted patterns at blocks 404 and 406 may be transmitted in continuous mode on the separate lines of the side band lane 300.

After transmitting bits of the first and second patterns, if (at block 408) the mode registers 212 continue to indicate fine read training mode, then control returns to block 404 to continue transmitting the patterns having the opposite values. If (at block 408) the fine mode training has ended, then the coarse read training phase may begin (at block 410).

Upon the memory controller logic 110 receiving (at block 412) the transmitted bit pattern, if (at block 414) the received bit is not the opposite value of the bit value stored in the training registers 116, 0 versus 1 or 1 versus zero, then the received bit is stored (at block 416) in the training registers 116. If (at block 414) the received bit value is the opposite of the stored bit value, then a determination is made (at block 418) of the timing at which the opposite bit (or pattern). The memory controller logic 110 then determines (at block 422) edges from the determined timing by changing timings to read, i.e., sweep, outward from the determined timing in both directions until a match is not found, at which point the edges of the data eye are determined, in each direction from the determined timing at which the opposite bit pattern was received. The data eye is then determined (at block 422) to be at a timing between the timing of the edges. In one embodiment, the edges of the data eye are determined by changing the phase interpolator 112 timings to sweep outward from the determined data eye in each direction to find the point at which there is no match.

Based on these timing signals, a determination is made (at block 424) of a setting to control the phase interpolator 112 to generate interpolated signals used to sample data at the determined data eye. After training the phase interpolator 112 to generate interpolated signals for sampling at the data eye between the edges, the memory controller logic 110 writes (at block 426) to the mode register 212 of the memory module 220 to stop fine read training mode to stop the memory module controller from continuing to send opposite bit patterns on the side band lane 300.

In certain embodiments, detection of transitions between a sample of a 1 and 0, and vice versa, indicates a timing having read data, which may comprise the data eye, the edges or read data between the edges. These training operations may require four training result bits to capture even/odd per signal. Two bits may be used if only capturing even or odd. The phase interpolator 112 is configured to generate an interpolated sample to read data in the middle of the margins of the data eye.

In the above described embodiment, a bit of the pattern is compared to determine the determined timing at which to start sweeping for the edges of the data eye. In an alternative embodiment, the memory controller 110 may not compare just a bit, but instead the entire pattern (e.g., 0101, 1010), so that the data eye is determined at blocks 414 and 418 at the timing at which the opposite of the stored pattern is detected, not just a single bit. Further, in such embodiments where the entire pattern is compared, the entire pattern would be stored at block 416 in the training registers 116, not just a single bit.

Figure 5:
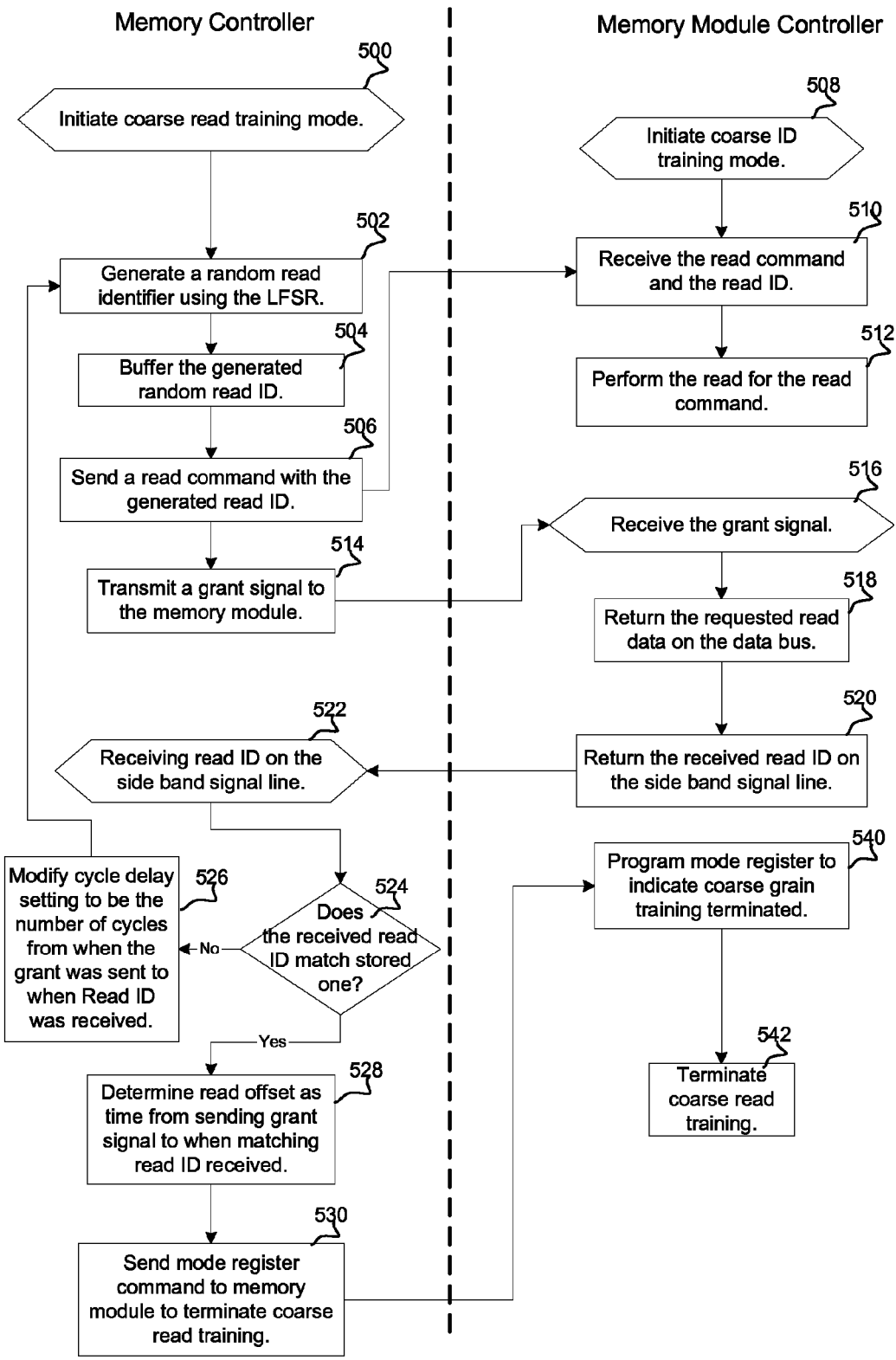
FIG. 5 illustrates an embodiment of operations to perform coarse read training to determine a read offset at which the read data is received.

FIG. 5 illustrates an embodiment of operations performed by the memory controller logic 110 and the memory module controller 202 logic to allow the memory controller logic 110 in conjunction with the memory module 200 to perform coarse read training of the memory controller 104 to determine an offset or timing to wait before the memory controller 104 activates to read data following a grant signal sent to retrieve read data. Upon initiating (at block 500) coarse read training, the memory controller logic 110 generates (at block 502) a random read ID using the LFSR 114. The generated read ID is buffered (at block 504) in the training registers 116. The memory controller logic 110 sends (at block 506) a read command with the generated read ID to the memory module 200. While the memory module controller 210 is operating in a coarse read training mode (at block 508), upon receiving (at block 510) the read command and the read ID, the memory module controller 210 performs the read command (at block 512).

After sending the read command with the read ID (at block 506), the memory controller logic 110 transmits (at block 514) a grant signal to the memory module 200 over the bus interface 108. Upon receiving (at block 516) the grant signal, the requested data is returned (at block 518) on the data bus 306 and the received read ID is returned (at block 520) on the side band lane 300. The read ID signal is returned in burst mode. In certain embodiments, the read ID is returned first before the read data on the side band read ID signal 300. In this way, the memory module controller 200 loops back the read ID to the memory controller 104 without filtering or interpreting of the data. In certain embodiments, the memory controller logic 110 may provide the grant signal without waiting for an acknowledgment (ACK) from the memory module 200 for the read command.

Upon the memory controller 104 receiving (at block 522) the read ID on the side band lane 300, the memory controller logic 110 determines (at block 524) whether the received read ID matches the transmitted read ID stored in the training registers 116. If (from the no branch of block 524) there is no match, then the memory controller logic 110 modifies (at block 526) a cycle delay setting to be the number of cycles from when the grant was sent to when the Read ID is received. The cycle delay settings is a coarse timing setting of when the memory controller logic 110 attempts to read the data, and this coarse cycle delay timing or cycle level time is adjusted at bock 526 until the timing matches when the read ID is received, or the round trip latency setting from when the grant is set. From block 526 control proceeds back to block 502 to continuously generate random read IDs for coarse read training until there is a match. If (at block 524) the sent and the received read ID match, then the memory controller logic 110 determines (at block 526) a read offset as a time differential from the sending of the grant signal to when the matching read ID received. After determining the read offset, the memory controller logic 110 may send (at block 530) a mode register command to the memory module 200 to determine coarse read training, The memory module controller 200 programs (at block 540) the mode registers 212 upon receiving the command to terminate (at block 542) coarse read training.

The fine read training produces settings to control the phase interpolator 112 to generate an interpolated sample signal to read within the data eye when the read data is transmitted and the result of the coarse read training step is a read offset that is used to determine when to start receiving read data after the grant signal is set. After the fine and coarse read training, normal read operations may begin using the determined phase interpolator 112 settings and read offset.

FIG. 6 illustrates an embodiment of operations performed by the memory controller logic 110 and the memory module controller 202 logic to perform advanced read training during normal read operations to further improve the phase interpolator 112 settings used to generate the sample signal used to sample the read data signal. Upon initiating (at block 600) advanced training during normal read/write operations using the determined phase interpolator settings and the read offset, the memory controller logic 110 performs (at block 602) the operations at blocks 502-514 in FIG. 5 to generate and transmit the read ID signal with the read command. While in the advanced training mode during normal read/write operations (at block 604), the memory module controller 210 performs (at block 606) the operations at blocks 510, 512, 516, 518 in FIG. 5 to process a received read command and return the read ID on the side band lane 300.

Upon the memory controller 104 receiving (at block 608) the read ID on the side band lane 300, if (at block 610) the received read ID matches the transmitted read ID stored in the training registers 116, then a timing at which the read ID was read is determined (at block 612). The memory controller logic 110 then performs (at block 614) the operations at blocks 418 to 426 to determine the edges from the determined Read ID timing, a data eye from the determined edges, and a setting to control the phase interpolator to generate interpolated signals used to sample data at the determined data eye. These operations to adjust the phase interpolator 112 using the randomly generated read IDs are continually performed to determine the margins of the data eye and recenter the phase interpolator 112 settings with more aggressive and realistic patterns in the form of the randomly generated read IDs, as opposed to the repeating opposite patterns used during the fine read training.

If (from the no branch of block 610) there is no match, then the memory controller logic 110 modifies (at block 616) a cycle delay setting to be the number of cycles from when the grant was sent to when the Read ID is received. The cycle delay settings is a coarse timing setting of when the memory controller logic 110 attempts to read the data, and this coarse cycle delay timing or cycle level time is adjusted at bock 526 until the timing matches when the read ID is received, or the round trip latency setting from when the grant is set. From block 616 control proceeds back to block 602 to continuously generate random read IDs for the advanced fine grain training until there is a match.

Described embodiments enable training of the side-band Read ID signals on the read ID line 300 to achieve low bit error rates on the bus 100. The described read training is efficient in that it achieves eye centered sampling with a simple pattern. Described embodiments may further generate high-stress patterns on the read ID bus 300, in order to determine worst-case margins.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The described operations of the memory controller 104 and the memory modules 200 may be implemented as a method, apparatus or computer readable storage medium using standard programming and/or engineering techniques to produce software, firmware, hardware, or any combination thereof. The described operations may be implemented as code or logic maintained in a "computer readable storage medium", which may directly execute the functions or where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The computer readable storage medium may further comprise digital logic implemented in a hardware device (e.g., an integrated circuit chip, a programmable logic device, a Programmable Gate Array (PGA), field-programmable gate array (FPGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration without departing from the scope of the present invention, and that the article of manufacture may comprise suitable information bearing medium known in the art.

EXAMPLES

The following examples pertain to further embodiments.

Example 1 is a device coupled to at least one memory module over a bus, comprising: a bus interface to the at least one memory module; memory controller logic that when operates performs operations, the operations comprising: programming the memory module to initiate a training mode in which the memory module transmits continuous bit patterns on a side band lane of the bus interface; receiving the bit patterns over the bus interface; determining from the received bit patterns a transition of values in the bit pattern to determine a data eye between the determined transitions of the values; and determining a setting to control a phase interpolator to generate interpolated signals used to sample data within the determined data eye.

In Example 2, the subject matter of Example 1 can optionally include that the operations further comprise: programming the memory module to terminate the training mode and sending the bit patterns in response to determining the data eye and the setting to control the phase interpolator In Example 3, the subject matter of Example 1 can optionally include that the determining from the received clock bit patterns the transition comprises: storing a read value from the bit pattern in a register; and determining whether a subsequently read value from a subsequent transmission of the bit pattern matches the read value in the register, wherein the data eye is determined between edges of two read values that match values stored in the register.

In Example 4, the subject matter of Example 1 can optionally include that the bit patterns comprises a first continuous bit pattern on the side band lane of the bus interface used for read identifier signals and a second continuous bit pattern on the side band lane, wherein the first and second continuous bit patterns have opposite values.

In Example 5, the subject matter of Example 4 can optionally include that the first continuous bit pattern is sent on a first read identifier signal line and comprises a continuous 1010 pattern and wherein the second continuous pattern is sent on a second read identifier signal line and comprises a continuous 0101 pattern.

In Example 6, the subject matter of Example 5 can optionally include that the first and second continuous patterns alternate between a 0 and 1 every clock interval to create a clock pattern having a period twice the period of a clock interval on the bus interface.

In Example 7, the subject matter of Example 1 can optionally include that the bus interface includes command lines on which commands are transmitted, data lines on which data is transmitted, and read identifier signal lines, wherein the bit patterns are transmitted on the read identifier signal lines at a command frequency less than a clock frequency.

In Example 8, the subject matter of Example 1 can optionally include that the operations further comprise: in response to determining the setting to control the phase interpolator, sending a read command with a read identifier to the memory module; receiving read data from the memory module including a returned read identifier; and determining a read offset in response to determining the returned read identifier matches the read identifier sent with the read command, wherein the read offset is used to determine when to start sampling the read data in the data eye using the determined setting for the phase interpolator.

Example 9 is a device coupled to at least one memory module over a bus, comprising: a bus interface to the at least one memory module; memory controller logic that when operates performs coarse read training operations, the operations comprising: sending a read command and a read identifier to the memory module; receiving read data and a received read identifier from the memory module over the bus interface; and determining a read offset in response to determining the received read identifier from the memory module includes the read identifier sent with the read command, wherein the read offset is used to determine when to start sampling data in a data eye of received read data.

In Example 10, the subject matter of Example 9 can optionally include that the operations further comprise: in response to determining that the received read identifier does not match the read identifier sent with the read command, performing at least one iteration of generating a new read identifier to include in a new read command sent to the memory module until the read offset is determined in response to the received read data from the memory module including the generated new read identifier.

In Example 11, the subject matter of Example 10 can optionally include a Linear Feedback Shift Register (LFSR) used to generate the read identifier and the new read identifiers to provide random read identifier values.

In Example 12, the subject matter of Example 9 can optionally include that the coarse read training is terminated in response to the received read identifier including the read identifier sent with the read command.

In Example 13, the subject matter of Example 9 can optionally include that the read identifier causes the memory module to loopback the read identifier when returning the read data in response to the read command.

In Example 14, the subject matter of Example 9 can optionally include that the read identifier is transmitted from the memory module on the side band lane.

In Example 15, the subject matter of Example 8 can optionally include that the bus interface includes command lines on which commands are transmitted, data lines on which data is transmitted, and a read identifier signal lines, wherein the memory module returns the read identifier on the read identifier signal lines.

In Example 16, the subject matter of Example 15 can optionally include that the read identifier is returned on clock signals from the memory module.

In Example 17, the subject matter of Example 9 can optionally include that the operations further comprise: sending a grant signal to the memory module following the sending of the read command, wherein the memory module sends the read identifier signal in response to the grant signal, wherein the read offset measures a time when data arrives after the grant signal is sent.

Example 18 is a device coupled to at least one memory module over a bus, comprising: a bus interface to the at least one memory module; a phase interpolator; memory controller logic that when operates performs coarse read training operations, the operations comprising: using a read identifier returned from the memory module on a side band lane of the bus interface separate from command and data signal lines of the bus interface to determine a read offset at which read data is sampled on the bus interface; and while using the read offset to determine when to start sampling data in a data eye of read data, performing: sending a read command with a read identifier to the memory module; receiving a received read identifier from the memory module on the side band lane of the bus interface; in response to determining the received read identifier matches the read identifier sent with the read command: determining the data eye as where the received read identifier was read; and determining a setting to control the phase interpolator to generate interpolated signals used to sample data at the determined data eye at which the received read identifier was read.

In Example 19, the subject matter of claim 18 can optionally include that the using the read identifier to determine the read offset comprises: sending a read command with a read identifier to the memory module; receiving read data and a received read identifier from the memory module over the bus interface, wherein the received read identifier is received on the side band lane of the bus interface; determining the read offset as a timing at which the received read data matches the read identifier sent with the read command.

In Example 20, the subject matter of claim 18 can optionally include that a Linear Feedback Shift Register (LFSR) used to generate the read identifiers during the coarse read training and while using the read offset to determine when to start sampling data in the data eye.

Example 21 is a computer readable storage medium coupled to at least one memory module over a bus interface to a bus, wherein the computer readable storage medium implements logic that when executed performs operations comprising: programming the memory module to initiate a training mode in which the memory module transmits continuous bit patterns on a side band lane of the bus interface; receiving the bit patterns over the bus interface; determining from the received bit patterns a transition of values in the bit pattern to determine a data eye between the determined transitions of the values; and determining a setting to control a phase interpolator to generate interpolated signals used to sample data within the determined data eye.

In Example 22, the subject matter of claim 21 can optionally include that the bit patterns comprises a first continuous bit pattern on the side band lane of the bus interface used for read identifier signals and a second continuous bit pattern on the side band lane, wherein the first and second continuous bit patterns have opposite values.

In Example 23, the subject matter of claim 18 can optionally include that the operations further comprise: in response to determining the setting to control a phase interpolator, sending a read command with a read identifier to the memory module; receiving read data from the memory module including a returned read identifier; and determining a read offset in response to determining the returned read identifier matches the read identifier sent with the read command, wherein the read offset is used to determine when to start sampling the read data in the data eye using the determined setting for the phase interpolator.

Example 24 is a computer readable storage medium coupled to at least one memory module over a bus interface to a bus to perform coarse read training operations, wherein the computer readable storage medium implements logic that when executed performs operations comprising: sending a read command and a read identifier to the memory module; receiving read data and a received read identifier from the memory module over the bus interface; and determining a read offset in response to determining the received read identifier from the memory module includes the read identifier sent with the read command, wherein the read offset is used to determine when to start sampling data in a data eye of received read data.

In Example 25, the subject matter of claim 24 can optionally include that the operations further comprise: in response to determining that the received read identifier does not match the read identifier sent with the read command, performing at least one iteration of generating a new read identifier to include in a new read command sent to the memory module until the read offset is determined in response to the received read data from the memory module including the generated new read identifier.

Example 26 is a method for training a bus interface to a bus coupled to at least one memory module over a bus interface, comprising: programming the memory module to initiate a training mode in which the memory module transmits continuous bit patterns on a side band lane of the bus interface; receiving the bit patterns over the bus interface; determining from the received bit patterns a transition of values in the bit pattern to determine a data eye between the determined transitions of the values; and determining a setting to control a phase interpolator to generate interpolated signals used to sample data within the determined data eye.

In Example 27, the subject matter of claim 26 can optionally include that the bit patterns comprises a first continuous bit pattern on the side band lane of the bus interface used for read identifier signals and a second continuous bit pattern on the side band lane, wherein the first and second continuous bit patterns have opposite values.

In Example 28, the subject matter of claims 26 and 27 can optionally include a machine readable medium including code, when executed, to cause a machine to perform the method of any one of claims 26 and 27.

Example 29 is method for training a bus interface to a bus coupled to at least one memory module over a bus interface, comprising: sending a read command and a read identifier to the memory module; receiving read data and a received read identifier from the memory module over the bus interface; and determining a read offset in response to determining the received read identifier from the memory module includes the read identifier sent with the read command, wherein the read offset is used to determine when to start sampling data in a data eye of received read data.

In Example 30, the subject matter of claim 29 can optionally include that the operations further comprise: in response to determining that the received read identifier does not match the read identifier sent with the read command, performing at least one iteration of generating a new read identifier to include in a new read command sent to the memory module until the read offset is determined in response to the received read data from the memory module including the generated new read identifier.

Example 31 an apparatus coupled to at least one memory module over a bus, comprising: means for programming the memory module to initiate a training mode in which the memory module transmits continuous bit patterns on a side band lane of the bus interface; means for receiving the bit patterns over the bus interface; means for determining from the received bit patterns a transition of values in the bit pattern to determine a data eye between the determined transitions of the values; and means for determining a setting to control a phase interpolator to generate interpolated signals used to sample data within the determined data eye.

In Example 32, the subject matter of claim 31 can optionally include means for programming the memory module to terminate the training mode and sending the bit patterns in response to determining the data eye and the setting to control the phase interpolator.

In Example 33, the subject matter of claim 31 can optionally include that the means for determining from the received clock bit patterns the transition comprises: means for storing a read value from the bit pattern in a register; and means for determining whether a subsequently read value from a subsequent transmission of the bit pattern matches the read value in the register, wherein the data eye is determined between edges of two read values that match values stored in the register.

In Example 34, the subject matter of claim 31 can optionally include means for sending a read command with a read identifier to the memory module in response to determining the setting to control the phase interpolator; means for receiving read data from the memory module including a returned read identifier; and means for determining a read offset in response to determining the returned read identifier matches the read identifier sent with the read command, wherein the read offset is used to determine when to start sampling the read data in the data eye using the determined setting for the phase interpolator.

In Example 35, the subject matter of claim 34 can optionally include means for performing at least one iteration of generating a new read identifier to include in a new read command sent to the memory module until the read offset is determined in response to the received read data from the memory module including the generated new read identifier in response to determining that the received read identifier does not match the read identifier sent with the read command.

In Example 36, the subject matter of claim 31 can optionally include means for using a read identifier returned from the memory module on a side band lane of the bus interface separate from command and data signal lines of the bus interface to determine a read offset at which read data is sampled on the bus interface; and means for using the read offset to determine when to start sampling data in a data eye of read data by performing: sending a read command with a read identifier to the memory module; receiving a received read identifier from the memory module on the side band lane of the bus interface; in response to determining the received read identifier matches the read identifier sent with the read command: determining the data eye as where the received read identifier was read; and determining a setting to control the phase interpolator to generate interpolated signals used to sample data at the determined data eye at which the received read identifier was read.

What is claimed:

1. A device comprising:
    a bus interface to at least one memory module;
    memory controller logic that when operates performs operations, the operations comprising:
        programming the memory module to initiate a training mode in which the memory module transmits continuous bit patterns on a side band lane of the bus interface;
        receiving the bit patterns over the bus interface;
        determining from the received bit patterns a transition of values in the bit pattern to determine a data eye between the determined transitions of the values; and
        determining a setting to control a phase interpolator to generate interpolated signals used to sample data within the determined data eye.

2. The device of claim 1, wherein the operations further comprise:
    programming the memory module to terminate the training mode and sending the bit patterns in response to determining the data eye and the setting to control the phase interpolator.

3. The device of claim 1, wherein the determining from the received clock bit patterns the transition comprises:
    storing a read value from the bit pattern in a register; and
    determining whether a subsequently read value from a subsequent transmission of the bit pattern matches the read value in the register, wherein the data eye is determined between edges of two read values that match values stored in the register.

4. The device of claim 1, wherein the bit patterns comprises a first continuous bit pattern on the side band lane of the bus interface used for read identifier signals and a second continuous bit pattern on the side band lane, wherein the first and second continuous bit patterns have opposite values.

5. The device of claim 4, wherein the first continuous bit pattern is sent on a first read identifier signal line and comprises a continuous 1010 pattern and wherein the second continuous pattern is sent on a second read identifier signal line and comprises a continuous 0101 pattern.

6. The device of claim 5, wherein the first and second continuous patterns alternate between a 0 and 1 every clock interval to create a clock pattern having a period twice the period of a clock interval on the bus interface.

7. The device of claim 1, wherein the bus interface includes command lines on which commands are transmitted, data lines on which data is transmitted, and read identifier signal lines, wherein the bit patterns are transmitted on the read identifier signal lines at a command frequency less than a clock frequency.

8. The device of claim 1, wherein the operations further comprise:
    in response to determining the setting to control a phase interpolator, sending a read command with a read identifier to the memory module;
    receiving read data from the memory module including a returned read identifier; and
    determining a read offset in response to determining the returned read identifier matches the read identifier sent with the read command, wherein the read offset is used to determine when to start sampling the read data in the data eye using the determined setting for the phase interpolator.

9. A device, comprising:
    a bus interface to at least one memory module;
    memory controller logic that when operates performs coarse read training operations, the operations comprising:
        sending a read command and a read identifier to the memory module;
        receiving read data and a received read identifier from the memory module over the bus interface; and
        determining a read offset in response to determining the received read identifier from the memory module includes the read identifier sent with the read command, wherein the read offset is used to determine when to start sampling data in a data eye of received read data.

10. The device of claim 9, wherein the operations further comprise:
    in response to determining that the received read identifier does not match the read identifier sent with the read command, performing at least one iteration of generating a new read identifier to include in a new read command sent to the memory module until the read offset is determined in response to the received read data from the memory module including the generated new read identifier.

11. The device of claim 10, further including a:
    a Linear Feedback Shift Register (LFSR) used to generate the read identifier and the new read identifiers to provide random read identifier values.

12. The device of claim 9, wherein the coarse read training is terminated in response to the received read identifier including the read identifier sent with the read command.

13. The device of claim 9, wherein the read identifier causes the memory module to loopback the read identifier when returning the read data in response to the read command.

14. The device of claim 9, wherein the read identifier is transmitted from the memory module on the side band lane.

15. The device of claim 8, wherein the bus interface includes command lines on which commands are transmitted, data lines on which data is transmitted, and a read identifier signal lines, wherein the memory module returns the read identifier on the read identifier signal lines.

16. The device of claim 15, wherein the read identifier is returned on clock signals from the memory module.

17. The device of claim 9, wherein the operations further comprise:
sending a grant signal to the memory module following the sending of the read command, wherein the memory module sends the read identifier signal in response to the grant signal, wherein the read offset measures a time when data arrives after the grant signal is sent.

18. A device, comprising:
a bus interface to at least one memory module;
a phase interpolator;
memory controller logic that when operates performs coarse read training operations, the operations comprising:
using a read identifier returned from the memory module on a side band lane of the bus interface separate from command and data signal lines of the bus interface to determine a read offset at which read data is sampled on the bus interface; and
while using the read offset to determine when to start sampling data in a data eye of read data, performing:
sending a read command with a read identifier to the memory module;
receiving a received read identifier from the memory module on the side band lane of the bus interface;
in response to determining the received read identifier matches the read identifier sent with the read command:
determining the data eye as where the received read identifier was read; and
determining a setting to control the phase interpolator to generate interpolated signals used to sample data at the determined data eye at which the received read identifier was read.

19. The device of claim 18, wherein the using the read identifier to determine the read offset comprises:
sending a read command with a read identifier to the memory module;
receiving read data and a received read identifier from the memory module over the bus interface, wherein the received read identifier is received on the side band lane of the bus interface;
determining the read offset as a timing at which the received read data matches the read identifier sent with the read command.

20. The device of claim 18, further including a:
a Linear Feedback Shift Register (LFSR) used to generate the read identifiers during the coarse read training and while using the read offset to determine when to start sampling data in the data eye.

* * * * *